United States Patent [19]

Bertagnolli et al.

[11] Patent Number: 5,767,001
[45] Date of Patent: Jun. 16, 1998

[54] PROCESS FOR PRODUCING SEMICONDUCTOR COMPONENTS BETWEEN WHICH CONTACT IS MADE VERTICALLY

[75] Inventors: Emmerich Bertagnolli; Helmut Klose, both of München, Germany

[73] Assignee: Siemens Aktiengesellschaft, Munich, Germany

[21] Appl. No.: 545,650

[22] PCT Filed: May 2, 1994

[86] PCT No.: PCT/DE94/00486

§ 371 Date: Nov. 3, 1995

§ 102(e) Date: Nov. 3, 1995

[87] PCT Pub. No.: WO94/25981

PCT Pub. Date: Nov. 10, 1994

[30] Foreign Application Priority Data

May 5, 1993 [DE] Germany ................... 43 14 907.3

[51] Int. Cl.[6] ................ H01L 21/283; H01L 21/302
[52] U.S. Cl. ............... 438/455; 438/459; 438/650; 438/661; 438/667
[58] Field of Search ............... 438/455, 456, 438/459, 667, 363, 426, 622, 623, 624, 631, 632, 633, 648, 650, 660, 661

[56] References Cited

U.S. PATENT DOCUMENTS 4,394,712  7/1983  Anthony .
4,893,174  1/1990  Yamada et al. .
4,939,568  7/1990  Kato et al. .
5,034,347  7/1991  Kakihana ................... 437/187
5,401,672  3/1995  Kurtz et al. ................ 437/186
5,447,871  9/1995  Goldstein ................... 437/14
5,627,106  5/1997  Hsu .......................... 438/459

FOREIGN PATENT DOCUMENTS 0238089   9/1987  European Pat. Off. .
92/03848  3/1992  WIPO .

*Primary Examiner*—T. N. Quach
*Attorney, Agent, or Firm*—Hill & Simpson

[57] ABSTRACT

A process for producing components having a contact structure provides for vertical contact-making, in which, for the connection of a metal contact of a first component to a metal contact of a second component, the substrate is etched out, starting from the top, in a region provided for a vertical, conductive connection, this recess is filled with a metal so that said metal is connected to the surface of the metal contact, the rear side of the substrate is removed until the metal projects beyond the rear side, a metallization layer made of a metal having a low melting point, for example AuIn, is applied to the metal contact of the second component, the surface of the second component is provided with a planar layer, the two components are arranged vertically with respect to one another and a permanent contact is produced between the metal of the first component and the metallization layer of the second component by pressing one onto the other and heating.

4 Claims, 5 Drawing Sheets

PROCESS FOR PRODUCING SEMICONDUCTOR COMPONENTS BETWEEN WHICH CONTACT IS MADE VERTICALLY

BACKGROUND OF THE INVENTION

1. Field of the Invention

The present invention relates to a process for producing semiconductor components having a special contact structure which is provided for vertical, electrically conductive connection of a plurality of semiconductor components.

2. Description of the Related Art

Semiconductor circuits are produced nowadays using planar technology. The achievable complexity on a chip is limited by its size and the achievable fineness of the structure. The performance of a system comprising a plurality of semiconductor chips connected to one another is considerably limited in the cases of conventional technology by the limited number of possible connections between individual chips via connection contacts, the low speed of signal transfer via such connections between different chips, the limited speed in the case of complex chips due to extensively branched conductor tracks, and the high power consumption of the interface circuits.

These evinced limitations in the use of planar technology can be overcome using three-dimensional interconnection techniques. The arrangement of the functional planes above one another allows parallel communication between these components with a low requirement for electrically conductive connections in one plane, and speed-limiting interchip connections are additionally avoided.

A known process for producing three-dimensional ICs (integrated circuits) is based on depositing a further semiconductor layer over a plane of components, recrystallizing the layer using a suitable process (for example, a local heating process by means of a laser) and implementing therein a further component plane. This technique, too, has considerable limitations as a result of the thermal loading of the lower plane during recrystallization and the achievable yield which is limited by defects.

An alternative process from NEC produces the individual component planes separately from one another. These planes are thinned to a few pm and connected to one another by means of wafer bonding. The electrical connections are produced by providing: the front and rear sides of the individual component planes with contacts for interchip connection. This process has the following disadvantages and limitations: The thinned wafers must be processed on the front side and on the rear side using technical processes (lithography with adjustment by the semiconductor wafer). Testing for functionality of the individual planes prior to assembly is made more difficult by the fact that in this process individual components, but not complete circuits, are implemented in each plane. By thinning the wafers right down to the functional elements, SOI-like component structures are produced, with the result that use cannot be made of wafers which have been preproduced using standard technologies (for example standard CMOS).

It is the object of the present invention to specify a process for the simple production of semiconductor components having a contact structure suitable for three-dimensional contact-making as well as a process for the electrically conductive contact-making of a plurality of semiconductor components of this type.

This object is achieved by the process having the steps of claim 1. Further refinements emerge from the dependent claims.

In the production process according to the invention, the contact structure is produced by vertically etching out the substrate of the component, starting from the overgrown top, until there can be introduced into this pin-shaped recess a metallization layer which makes electrically conductive contact with the metal layer or semiconductor layer with which contact is to be made. The bottom of the substrate is ground back or etched back until this pin-shaped metallization layer projects beyond the substrate at the bottom. This projecting pin can be used to connect this semiconductor component in a permanently electrically conductive manner to a suitably produced contact, made of a metal having a low melting point, on the top of a further semiconductor component.

BRIEF DESCRIPTION OF THE DRAWINGS

There follows a description of the process according to the invention-with reference to FIGS. 1 to 8.

DETAILED DESCRIPTION OF THE PREFERRED EMBODIMENTS

For the sake of clarity, the rear contours, in the viewing direction, of the layer structure in the openings, which are mostly round in the example, have been omitted in the Figures.

In the production process according to the invention, the semiconductor components can be produced on semiconductor wafers which have been preproduced using standard technologies and are made, for example, of silicon. It is not necessary to intervene in the customary basic production process since the modification, necessary for the vertical connection, of the contact structure is carried out in process steps at the end of the production process.

Figure 1:
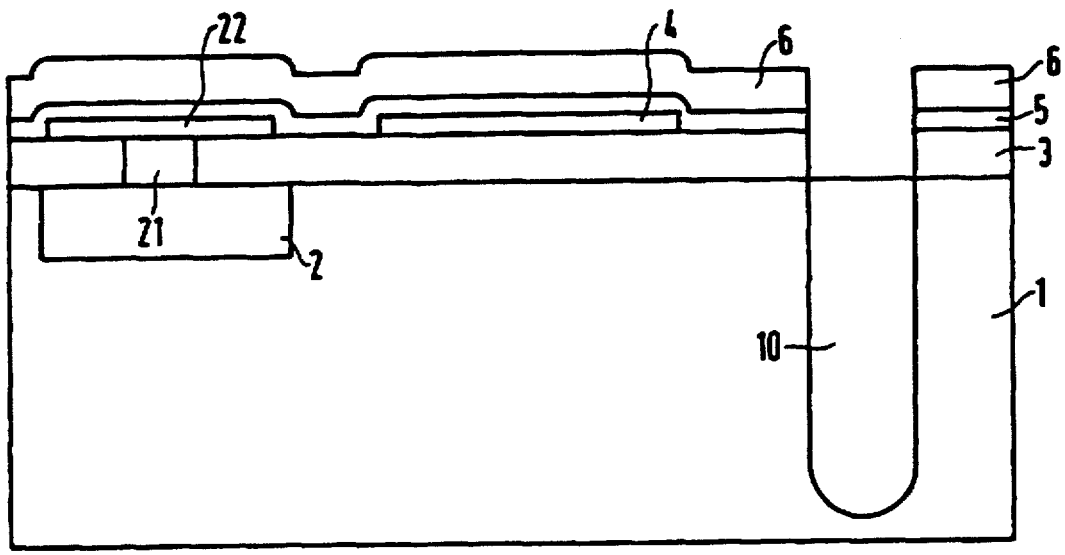
FIGS. 1 to 5 show a cross section of a component produced according to the invention after different steps of the production process.

The layer structure which is provided for the semiconductor component and is made, for example, of semiconductor layers, doped regions and metallization layers and metallization planes, such as, for example, interconnects, is produced starting from a substrate. FIG. 1 shows as an example the substrate 1 with a region 2 produced therein or thereon and belonging to a functional element. This region 2 is electrically conductively connected by means of a contact connection 21 (plug) in an insulation layer 3 to a metal contact 22, which can also be, for example, a portion of an interconnects. In this exemplary embodiment, a further metal contact 4 is to be electrically connected to a second semiconductor component. It is expedient, but not necessary, to cover the entire surface with a passivation layer 5 made, for example, of oxide nitride (that is to say a mixture of oxide and nitride). A dielectric layer 6 (for example oxide, in particular $SiO_2$) is deposited onto said passivation layer across the whole area. Using a mask, these layers as well as the layer structure and the material of the substrate are etched out in a region provided for the vertical, conductive connections. The recess 10 which is, for example, pin-shaped, is illustrated in FIG. 1 and is etched out to a sufficient depth for the subsequent process steps is obtained in this way. The surface produced in this way is covered across the whole area with a further passivation layer 7 made, for example, of oxide, as shown in FIG. 2.

Figure 2:
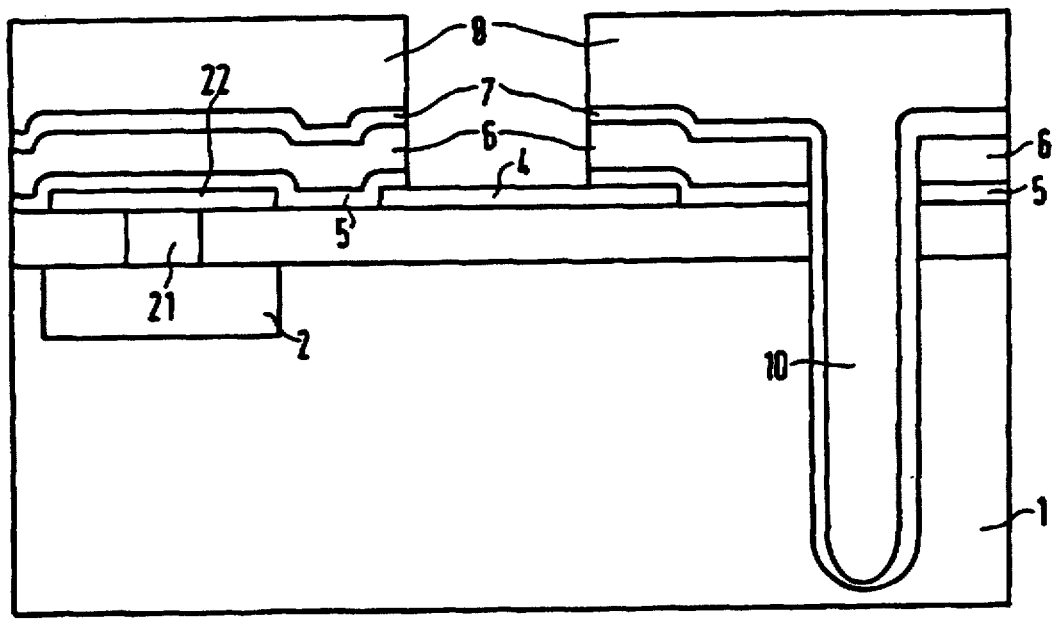
Figure 3:
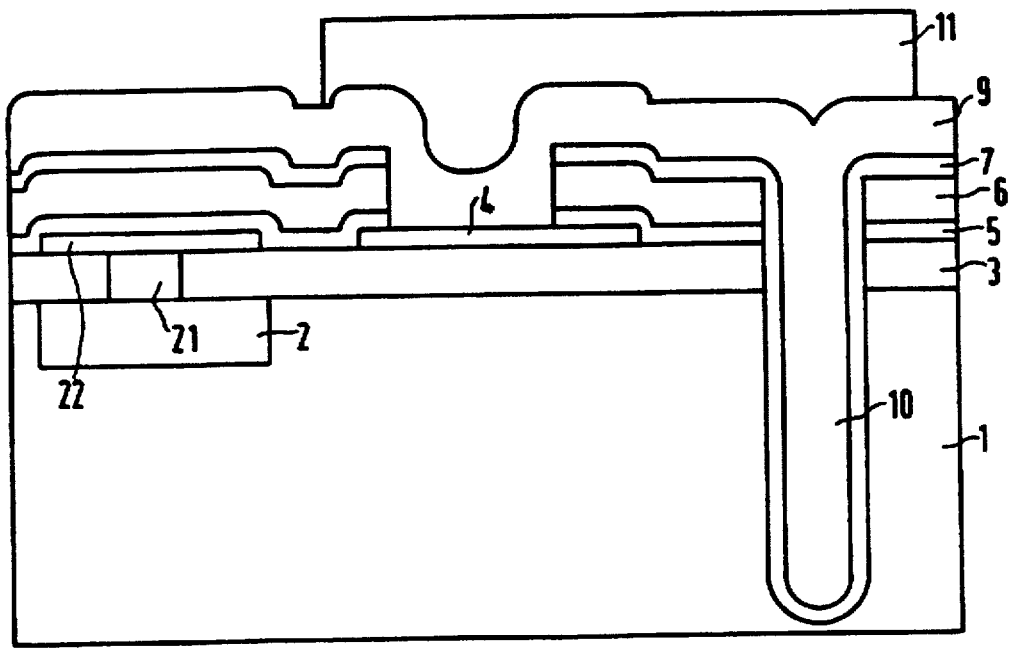

FIG. 2 shows a mask 8 applied to this structure and made, for example, of a photoresist. The surface of the metal contact 4 to be connected is exposed with the aid of this mask. After this mask 8 has been removed, the metal provided for the contact structure can be applied. Tungsten is particularly suitable for this and is applied, for example, by means of CVD (Chemical Vapor Deposition). As shown in FIG. 3, the recess 10 in the substrate is filled with this metal 9 and a contact, connected thereto, is produced on the surface of the metal contact 4. Therefore, the metal contact 4 is electrically conductively connected, via the metal 9, to the pin-shaped portion of the metal 9 of the recess 10 in the substrate.

Figure 4:
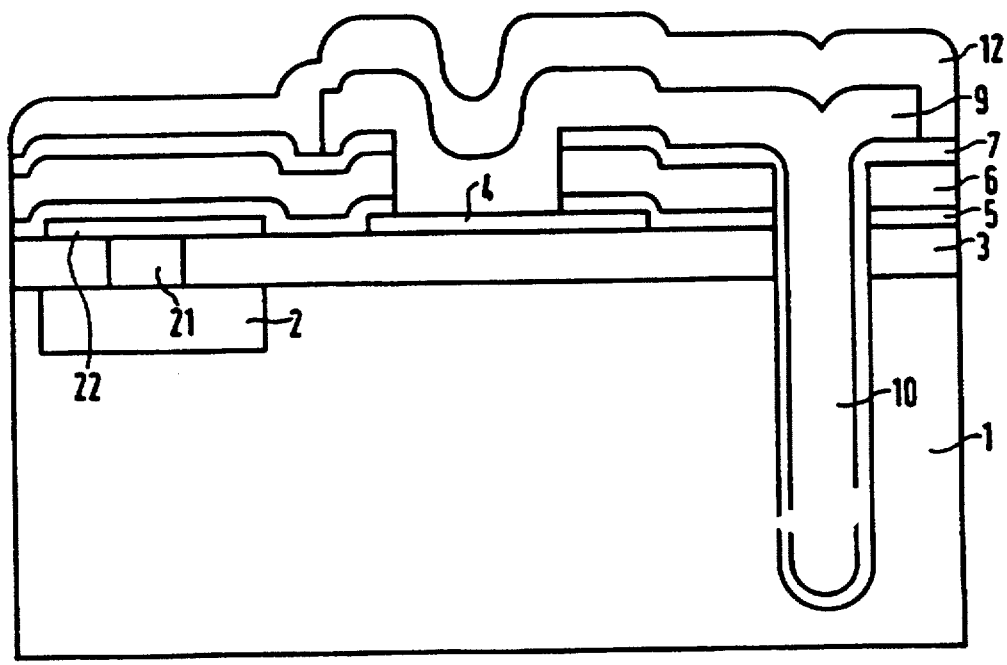

The structure shown in FIG. 3 is subsequently structured using a further mask 11 made, for example, of a photoresist in such a way that the portions of the metal 9 which remain are the portion on the metal contact 4 and the vertical, pin-shaped portion, which is electrically conductively connected to the former portion, in the recess 10 in the substrate. The surface is again covered with a passivation layer 12, as shown in FIG. 4. The pin-shaped portion of the applied metal 9 is electrically insulated from the surrounding material, in particular of the layer structure, by the passivation layer 7 beneath the metal 9.

Figure 5:
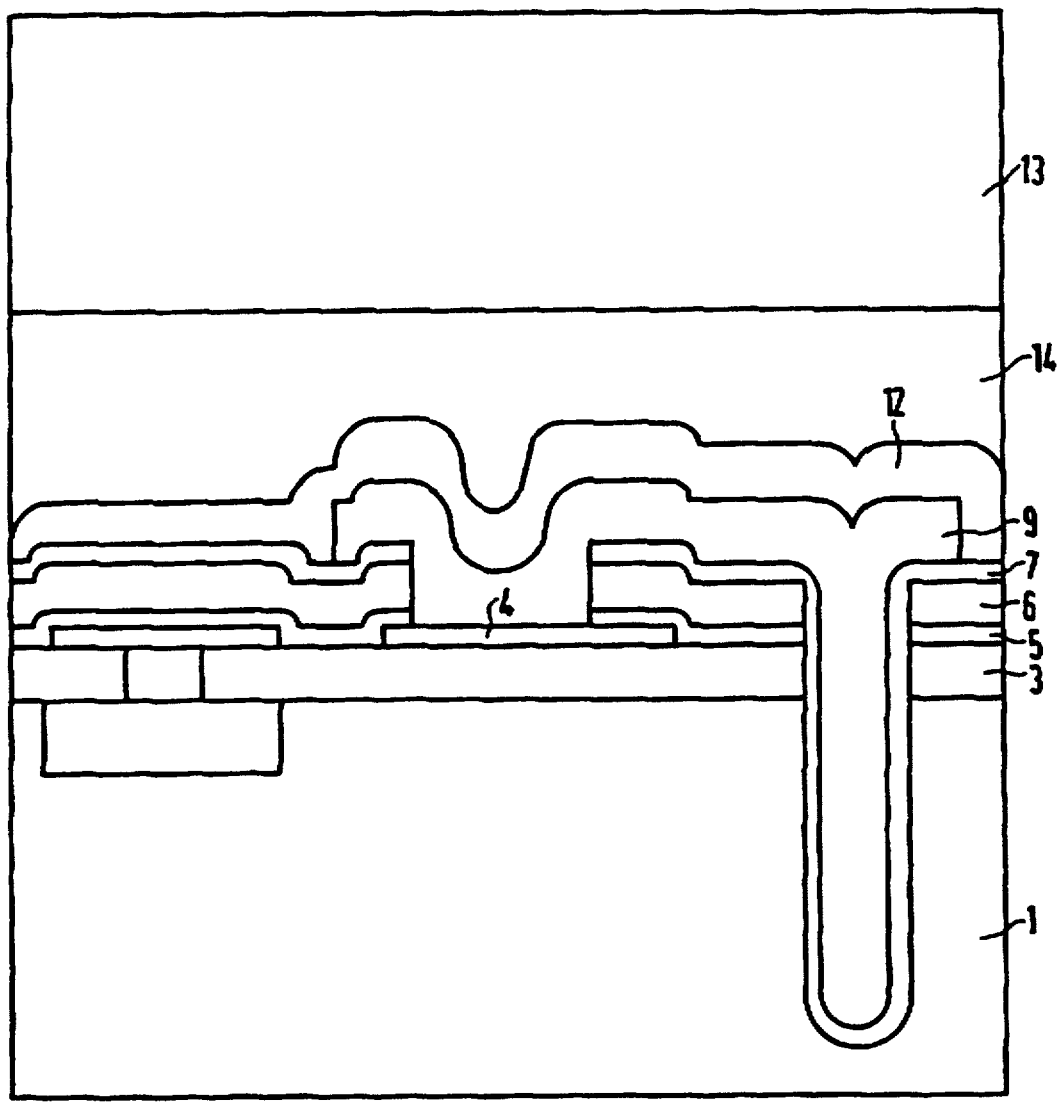
Figure 6:
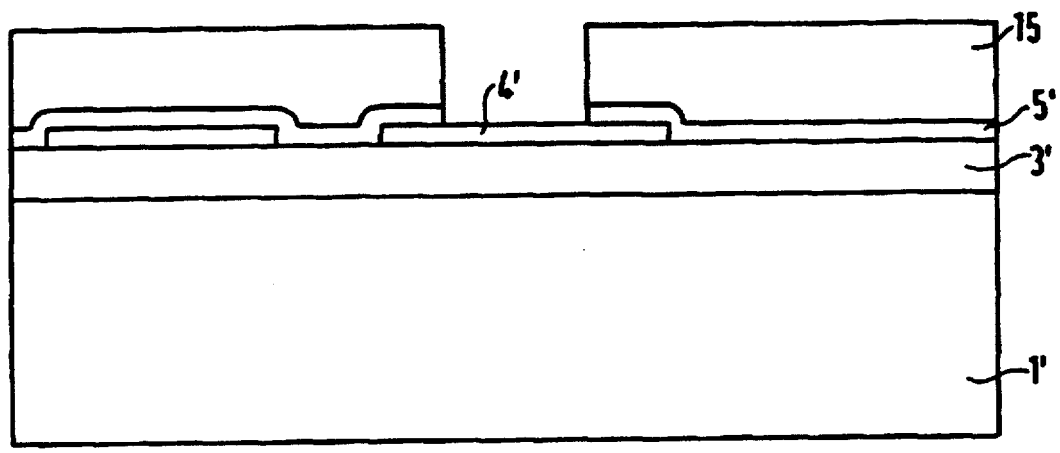
FIGS. 6 and 7 show a cross section of a further semiconductor component, which is to make contact with the former component, after different steps of the production process.
Figure 7:
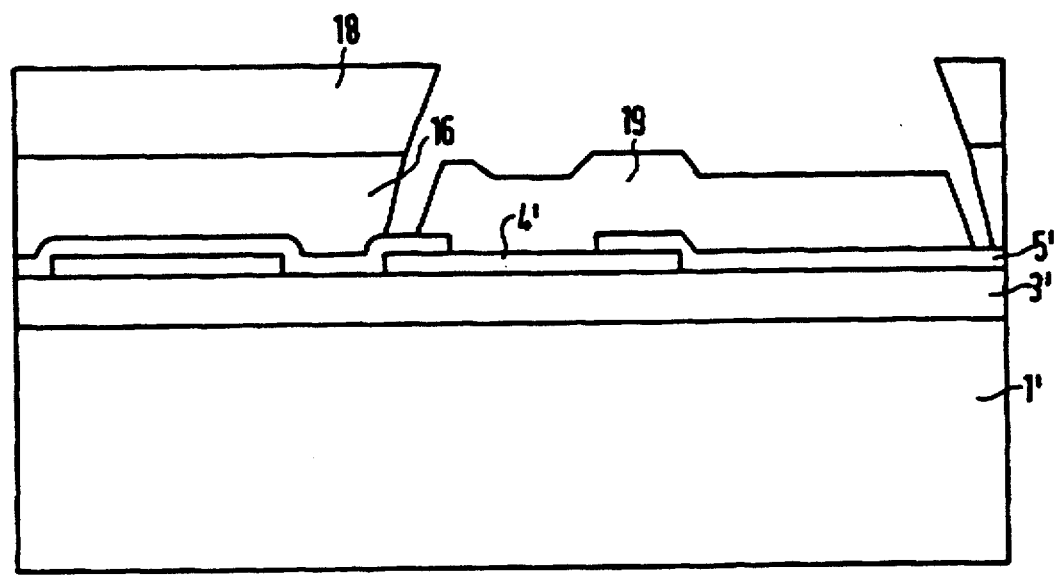

In the manner represented here by way of example, not only a metal contact 4 of this type, but also a region of a conductor track or a contact layer made of semiconductor material can be connected to a vertical portion of this contact structure to be produced. A plurality of metallization layers of this type can also be produced, in order to connect a plurality of metal contacts or contact layers in each case to a vertical, pin-shaped portion of a contact structure. In this way, a plurality of contacts of a semiconductor component which has been produced according to the invention can be electrically conductively connected to a semiconductor component which is arranged vertically beneath the former component and has corresponding connection contacts. In order to be able to connect the metal pins to a further semiconductor component at the bottom of the substrate 1, the substrate 1 is removed, starting from the rear side, for example by grinding back (for example by CMP, Chemical Mechanical Polishing), or etching back, until the vertical metal pins of the metal 9 project, out of the substrate at the rear side of the substrate. This process step is facilitated if a further substrate 13, as shown in FIG. 5, is fixed on the side having the layer structure. The further substrate 13 can be secured, for example, with an adhesive layer 14, as is shown in FIG. 5. The adhesive layer 14 can be, for example, polyimide or epoxy resin. Vertical contact is made with a further component by producing a corresponding contact made of metal on the second component at the point where the metal pin projects beyond the bottom of the substrate of the first component. FIG. 6 shows a cross section of such a further component. The metal contact 4' of this component is to be electrically conductively connected to the metal contact 4 of the first component, the intention being to arrange these components vertically above one another. There is again a layer structure on the substrate 1' of the second component, the layer structure being covered, for example, with an insulation layer 3' or being embedded in the insulation layer. The surface is covered with a passivation layer 5'. The surface of the metal contact 4' with which contact is to be made is exposed by means of a mask 15 made, for example, of a photoresist. In accordance with FIG. 7, a metallization layer 18, 19 is applied to the surface of the metal contact 4'. For this purpose, either the opening in the mask 15 is enlarged or the mask 15 is removed and a new mask 16 made, for example, of a photoresist is applied. The metallization layer is deposited, a portion 18 (see FIG. 7) being deposited on the mask 16 and removed together with the mask in a further process step. The remaining portion 19 of the metallization layer in the opening of the mask 16 is dimensioned such that the metallization layer 19 makes contact with the metal contact 4' and, in addition, a portion of the metallization layer 19 is present in the region provided for making contact with the first semiconductor component. The metal used is preferably a metal having a lower melting point than the metal which is otherwise customarily used for metallization layers and conductor tracks. A possible example of metal is AuIn.

Figure 8:
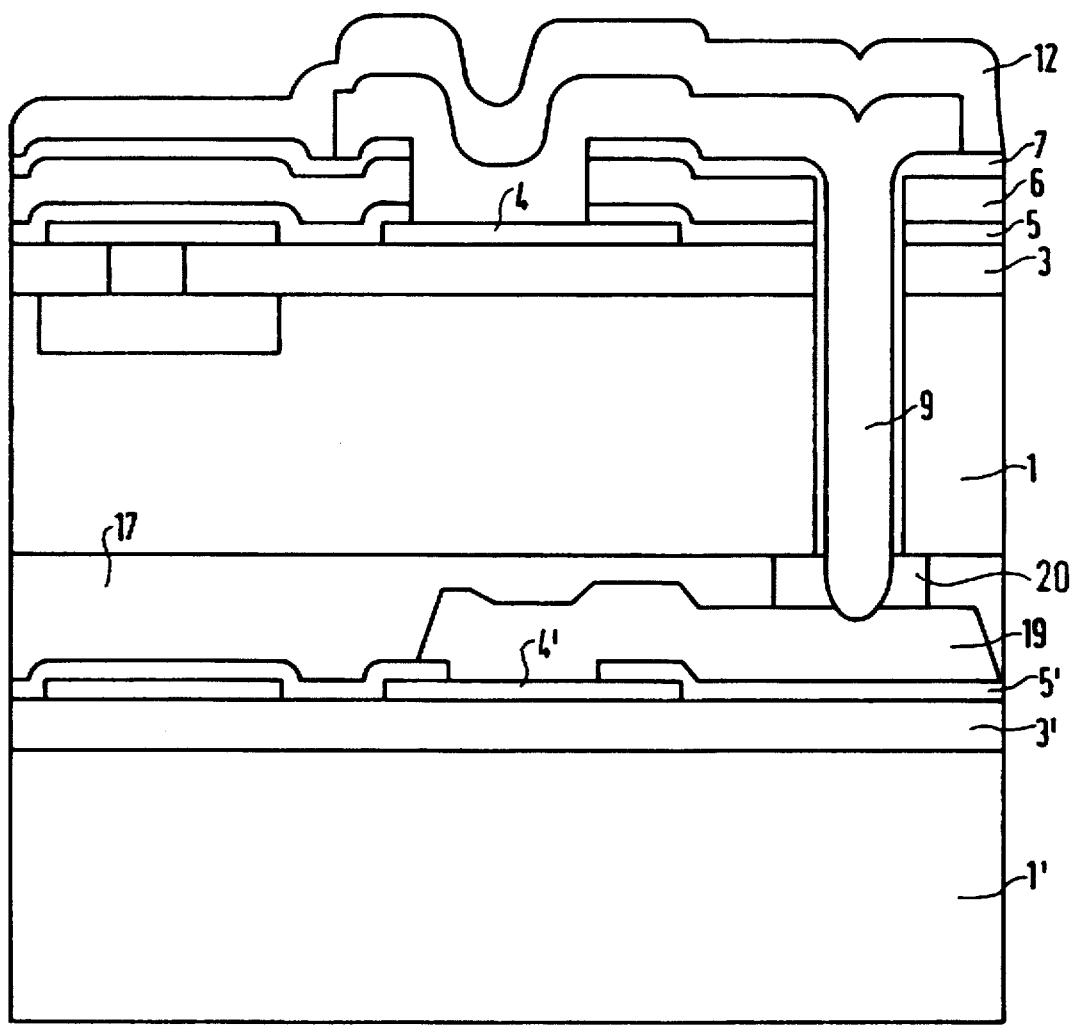
FIG. 8 shows a cross section of two components between which contact is made vertically according to the invention.

The two components represented in these examples are then connected as shown in FIG. 8. The components are arranged above one another and adjusted suitably with respect to one another. The surface of the lower semiconductor component is leveled by means of a planar layer 17 in order to be able to align the lower semiconductor component with the semiconductor component which is to be arranged above it. An opening 20 is produced in this planar layer 17 for the contact-making, above that region of the metallization layer 19 which has provided for the contact-making. The metal of the metallization layer 19 of the lower component is melted or softened by heating at least until it is possible by pressing the components together for the metal pin 9 to be forced into the metallization layer 19 and permanently connected thereto. Since the metal of the metallization layer 19 has a lower melting point, the semiconductor structures and other metallization layers are not detrimentally affected in this process step. As already mentioned, a plurality of contact connections of this type can be produced between the two components which are arranged vertically with respect to one another. In this way, these metal pins of the contact structure produced according to the invention enable various metal contacts or contact layers of the one component to be electrically connected to a respective contact of the second component.

In the process according to the invention, the electrical contacts are produced on the front side and the rear side of a component exclusively by production processes which are carried out from the top, i.e. the side that is provided with the layer structure, of the component. This process is therefore particularly suitable for implementing complex systems having a high requirement for electrical connection. The individual semiconductor planes connected vertically to one another do not have to be purely component planes, rather they are preferably entire circuit planes which can be pre-produced using standard technologies (for example CMOS, bipolar technology or memory production with multilayer metallization). This means that the individual circuit planes can be tested prior to the assembly of semiconductor components which are to be arranged vertically with respect to one another, as a result of which the yield is increased because only functional components are combined with one another.

It is also possible to produce sensors or actuators in the form of semiconductor components using the process according to the invention. The process according to the invention can be combined in an ideal way with the standard technologies for producing microelectronic components. An implementation using silicon is particularly advantageous because SOI (silicon on insulator) substrates having a useful layer made of silicon and situated on an insulation layer can then be used as the starting material. The process according to the invention for producing three-dimensionally integrated components is modular, that is to say the individual planes which are to make contact with one another can, in a mutually independent manner, be produced, tested and then connected to one another. The geometric arrangement of the metallization layers is not restricted to the exemplary embodiments but can have any desired configuration. The semiconductor topology limitations caused because of this are therefore minimal.

Although other modifications and changes may be suggested by those skilled in the art, it is the intention of the inventors to embody within the patent warranted hereon all changes and modifications as reasonably and properly come within the scope of their contribution to the art.

We claim:

1. A process for producing a semiconductor component having a contact structure for making vertical contact with a further semiconductor component, comprising the steps of:

in a first step, producing a contact location on a substrate having a layer structure on one side, said contact location being selected from a group consisting of: a contact layer of semiconductor material and with which contact is to be made, and a metal contact and an interconnect, in a second step, using a mask while etching a vertical recess into said substrate, starting from the one side provided with said layer structure, to a depth which is sufficient for a subsequent fourth step, in a third step, depositing a metal into said vertical recess and onto said contact location so that a portion of said metal which is introduced into said vertical recess is electrically conductively connected to that portion of said metal which is applied to said contact location, and in a fourth step, removing a second side of the substrate which is opposite the one side until the metal in the vertical recess projects beyond said second side of the substrate.

2. The process as claimed in claim 1, wherein the semiconductor components are of silicon.

3. A process for producing semiconductor components between which electrically conductive contact is made vertically, comprising the steps of: in a first step, producing a first semiconductor component including the substeps of:

in a first substep, producing a contact location on a substrate having a layer structure on one side, said contact location being selected from a group consisting of: a contact layer of semiconductor material and with which contact is to be made, and a metal contact and an interconnect;

in a second substep, using a mask while etching a vertical recess into said substrate, starting from the one side provided with said layer structure, to a depth which is sufficient for s subsequent fourth step;

in a third substep, depositing a metal into said vertical recess and into said contact location so that a portion of said metal which is introduced into said vertical recess is electrically conductively connected to that portion of said metal which is applied to said contact location, and in a fourth substep, removing a second side of the substrate which is opposite the one side until the metal in the vertical recess projects beyond said second side of the substrate and producing a second semiconductor component which is to make vertical contact with said first semiconductor component and has a layer structure having a contact location with which contact is to be made, said contact location being selected from a group consisting of a contact layer of semiconductor material and a metal contact and an interconnect, in a second step, using a mask to apply a metallization layer made of a metal having a lower melting point than that of an interconnect to said contact location as a region provided for making contact with the first semiconductor component, in a third step, arranging said first and second semiconductor components above one another in such a way that the metal projecting out of the vertical recess in the substrate of the first semiconductor component is situated above the region, provided for contact-making, of said metallization layer of the second semiconductor component, and in a fourth step, producing a permanent electrically conductive contact with the metal of the first semiconductor component by heating said metallization layer.

4. The process as claimed in claim 3, wherein tungsten is used for the metal projecting through the vertical recess in the substrate of the first semiconductor component, and AuIn is used for the metallization layer of the second semiconductor component, AuIn having a lower melting point than tungsten.

* * * * *